(12) United States Patent
Shiokawa et al.

(10) Patent No.: US 10,276,785 B2
(45) Date of Patent: Apr. 30, 2019

(54) SPIN CURRENT MAGNETIZATION ROTATIONAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/827,852

(22) Filed: Nov. 30, 2017

(65) Prior Publication Data
US 2018/0159026 A1 Jun. 7, 2018

(30) Foreign Application Priority Data
Dec. 2, 2016 (JP) ................................ 2016-235236

(51) Int. Cl.
| | |
|---|---|
| *H01L 27/22* | (2006.01) |
| *H01L 43/08* | (2006.01) |
| *H01L 43/02* | (2006.01) |
| *H01L 27/12* | (2006.01) |
| *H01L 43/10* | (2006.01) |
| *G11C 11/16* | (2006.01) |

(52) U.S. Cl.
CPC ............ *H01L 43/08* (2013.01); *G11C 11/161* (2013.01); *H01L 27/1222* (2013.01); *H01L 43/02* (2013.01); *H01L 43/10* (2013.01)

(58) Field of Classification Search
CPC ......... H01L 43/08; H01L 43/02; H01L 43/10; H01L 27/222; G11C 11/161

USPC ........................................................ 257/427
See application file for complete search history.

(56) References Cited

U.S. PATENT DOCUMENTS

| 8,350,347 B2 | 1/2013 | Gaudin et al. |
| 2014/0056061 A1* | 2/2014 | Khvalkovskiy ......... H01L 43/02 365/158 |

OTHER PUBLICATIONS

I.M. Miron et al.,"Perpendicular switching of a single ferromagnetic layer induced by in-plane current injection" Nature. pp. 189-194; Aug. 11, 2011; vol. 476.
S. Fukami et. al., "A spin-orbit torque switching scheme with collinear magnetic easy axis and current configuration" Nature Nanotechnology. pp. 1-6, Mar. 21, 2016.
S. Fukami et. al., "Magnetization switching by spin-orbit torque in an artiferromagnet-ferromagnet bilayer system" Nature Materials. pp. 1-8. Feb. 15, 2016.

(Continued)

*Primary Examiner* — Tu-Tu V Ho
(74) *Attorney, Agent, or Firm* — Oliff PLC

(57) ABSTRACT

A spin current magnetization rotational element includes: a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and an antiferromagnetic spin-orbit torque wiring that extends in a second direction intersecting with a first direction that is a lamination direction of the synthetic structure and is joined to the first ferromagnetic metal layer, wherein the spin current magnetization rotational element is configured to change a magnetization direction of the magnetization free layer by applying current to the antiferromagnetic spin-orbit torque wiring.

23 Claims, 4 Drawing Sheets

(56) References Cited

OTHER PUBLICATIONS

Y.K. Kato, et.al., "Observation of the Spin Hall Effect in Semiconductors" Science. pp. 1910-1913. (2004). vol. 306, pp. 1909-1913.
L.Liu et. al., "Spin torque switching with the giant spin Hall effect of tantalum" Mar. 12, 2012. 336.555.
L. Liu et. al., "Current-Induced Switching of Perpendicularly Magnetized Magnetic Layers Using Spin Torque from the Spin Hall Effect", Physical Review Letters. Aug. 29, 2012. vol. 109, pp. 096602.1-096602.5.
K.S. Lee et al., "Threshold current for switching of a perpendicular magnetic layer induced by spin Hall effect" Applied Physical Letters 102, 112410, Oct. 12, 2012. pp. 1-18.
K.S. Lee et al., "Thermally activated switching of perpendicular magnet by spin-orbit spin tourque" Applied Physical Letters, vol. 104, (2014), p. 1-6.
S. Takahashi et.al., "Spin injection and detection in magnetic nanostructures" Physical Review. vol. 67, Feb. 28, 2003, p. 1-4.

\* cited by examiner

SPIN CURRENT MAGNETIZATION ROTATIONAL ELEMENT, MAGNETORESISTANCE EFFECT ELEMENT, AND MAGNETIC MEMORY

BACKGROUND OF THE INVENTION

Technical Field

The present invention relates to a spin current magnetization rotational element, a magnetoresistance effect element, and a magnetic memory.

Priority is claimed on Japanese Patent Application No. 2016-235236, filed Dec. 2, 2016, the content of which is incorporated herein by reference.

Description of Related Art

A giant magnetoresistance (GMR) element composed of a multilayer film of a ferromagnetic metal layer and a non-magnetic layer and a tunneling magnetoresistance (TMR) element using an insulating layer (a tunnel barrier layer, a barrier layer) as a non-magnetic layer are known. In general, although the TMR element has higher element resistance than the GMR element, the magnetoresistance (MR) ratio is larger than the MR ratio of the GMR element. Therefore, TMR elements are of interest as elements for magnetic sensors, high frequency components, magnetic heads and nonvolatile random access memories (MRAM).

The MRAM reads and writes data by utilizing the characteristic that the element resistance of the TMR element varies when the directions of magnetization of the two ferromagnetic metal layers sandwiching the insulating layer are changed. As a writing method of MRAM, a method in which writing (magnetization rotation) is performed by utilizing a magnetic field generated by a current; and a method in which writing (magnetization rotation) is performed by utilizing a spin transfer torque (STT) generated by applying current in a lamination direction of a magnetoresistance effect element, are known. Although the magnetization rotation of the TMR element using STT is efficient from the viewpoint of energy efficiency, the reversal current density for magnetization rotation is high. From the viewpoint of the long life of the TMR element, it is desirable that the switching current density is low. This also applies to the GMR element.

Since the reversal current density by the STT increases in proportion to the volume of the ferromagnetic material, an attempt is made to reduce the reversal current density by reducing the volume of the ferromagnetic material. On the other hand, however, since the energy of the ferromagnetic material depends on the magnetic anisotropic energy and the volume of the ferromagnetic material, the magnetic record retention time is shortened if the volume of the ferromagnetic material is decreased. This is due to the fact that as the magnetic energy of the ferromagnetic material is reduced, the ferromagnetic material is thermally disturbed by heat from the outside, and the direction of magnetization thereof is changed. That is, in order to retain long-term information, a magnetoresistance effect element which is strong against thermal disturbance and has high thermal stability is required.

In recent years, attention has been focused on magnetization rotation utilizing a pure spin current generated by spin orbit interaction as a means for reducing the reversal current by a mechanism different from STT (for example, I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011)). Pure spin current generated by spin orbit interaction induces spin orbital torque (SOT) and causes magnetization rotation by SOT. Alternatively, even with a pure spin current caused by the Rashba effect at the interface of dissimilar materials, magnetization rotation is caused by the same SOT.

These mechanisms have not been elucidated so far. Pure spin current is generated by the same number of electrons of upward spin and downward spin electrons flowing in opposite directions, and the flow of electric charge is canceled. Therefore, the current flowing through the magnetoresistance effect element is zero, and realization of a magnetoresistance effect element with a small reversal current density is expected.

SUMMARY OF THE INVENTION

In Nature Nanotechnology (published online, DOI: 10/1038/NNANO.2016.29, S. Fukami, T. Ankawa, C. Zhang, and H. Ohno), it is reported that the reversal current density by SOT (hereinafter sometimes referred to as "SOT reversal current density") is about the same as the reversal current density by STT. In order to further reduce the reversal current density by SOT, it is necessary to use a material that produces a high spin Hall effect, that is, a material with high generation efficiency of pure spin current.

The problems of SOT are structural limitations and material limitations. Since SOT utilizes the torque generated at the interface between the ferromagnetic metal layer and the spin-orbit torque wiring, the ferromagnetic metal layer cannot be made thick. Thus, the thermal stability of the ferromagnetic metal layer deteriorates.

Therefore, in an element using SOT, an element with high thermal stability is required.

The present invention has been made in view of the above-described technical problems, and it is an object of the present invention to provide a spin current magnetization rotational element with high thermal stability, a magnetoresistance effect element and a magnetic memory using the spin current magnetization rotational element.

In order to solve the above-described technical problems, the present invention provides the following aspects.

(1) A spin current magnetization rotational element including:
a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and an antiferromagnetic spin-orbit torque wiring that extends in a second direction intersecting with a first direction that is a lamination direction of the synthetic structure and is joined to the first ferromagnetic metal layer, wherein the spin current magnetization rotational element is configured to change a magnetization direction of the magnetization free layer by applying current to the antiferromagnetic spin-orbit torque wiring.

(2) In the spin current magnetization rotational element according to the above-described (1), the antiferromagnetic spin-orbit torque wiring may be made of an antiferromagnetic material containing a metal selected from a group consisting of Cr, Mn, Fe, Ni, Cu, As, Rh, Pd, Ir, Pt and Au; or an antiferromagnetic material made of an alloy containing a metal selected from a group consisting of Cr, Mn, Fe, Ni, Cu, As, Rh, Pd, Ir, Pt and Au.

(3) In the spin current magnetization rotational element according to any one of the above-described (1) and (2), the first non-magnetic layer may be made of a non-magnetic metal selected from a group consisting of Cr, Cu, Mo, Ru, Rh, Re and Ir.

(4) In the spin current magnetization rotational element according to any one of the above-described (1) to (3), the antiferromagnetic spin-orbit torque wiring may be made of IrMn, magnetization of the first and second ferromagnetic metal layers may have an orthogonal component with respect to the first direction, and the orthogonal component of the first ferromagnetic metal layer and the orthogonal component of the second ferromagnetic metal layer may be antiparallel each other.

(5) In the spin current magnetization rotational element according to any one of the above-described (1) to (4), the spin current magnetization rotational element may be configured in such a way that a product of saturation magnetization and a volume of the first ferromagnetic metal layer equals to or more than a product of saturation magnetization and a volume of the second ferromagnetic metal layer.

(6) In the spin current magnetization rotational element according to any one of the above-described (1) to (5), a film thickness of the first ferromagnetic metal layer may be thinner than a film thickness of the second ferromagnetic metal layer, and an area of the first ferromagnetic metal layer as plan-viewed from an orthogonal direction may be larger than an area of the second ferromagnetic metal layer as plan-viewed from an orthogonal direction.

(7) A magnetoresistance effect element including: the spin current magnetization rotational element according to any one of the above-described (1) to (6); a magnetization fixed layer in which a magnetization direction is fixed; and a second non-magnetic layer sandwiched by the second ferromagnetic metal layer and the magnetization fixed layer.

(8) In the magnetoresistance effect element according to the above-described (7), the magnetization fixed layer may include the synthetic structure.

(9) A magnetic memory comprising a plurality of the magnetoresistance effect element according to above-described (7) or (8).

(10) A spin current magnetization rotational element including: a magnetization free layer, which includes a first ferromagnetic metal layer, a second ferromagnetic metal layer and a first non-magnetic layer sandwiched by the first ferromagnetic metal layer and the second ferromagnetic metal layer, magnetization directions of the first and second ferromagnetic metal layers being configured to be variable in such a way that the magnetization directions become antiparallel each other; and an antiferromagnetic spin-orbit torque wiring an antiferromagnetic spin-orbit torque wiring that extends in a second direction intersecting with a first direction that is a lamination direction of the magnetization fee layer and is joined to the first ferromagnetic metal layer, wherein the spin current magnetization rotational element is configured to change a magnetization direction of the magnetization free layer by applying current to the antiferromagnetic spin-orbit torque wiring.

Effect of the Invention

According to the spin current magnetization rotational element of the present invention, it is possible to provide a spin current magnetization rotational element with high thermal stability which utilizes magnetization rotation by pure spin current.

DETAILED DESCRIPTION OF THE INVENTION

Figure 1A:
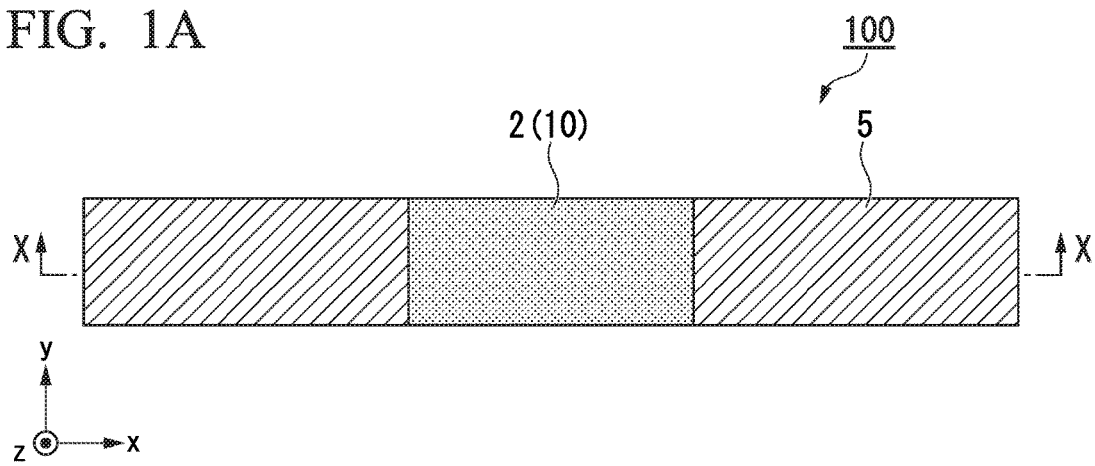
FIG. 1A is a schematic view for explaining a spin current magnetization rotational element according to an embodiment of the present invention and a plan view.

Hereinafter, the present invention will be described in detail with reference to the drawings. In the drawings used in the following description, for the sake of clarity of the features of the present invention, there are cases where characteristic portions are enlarged for the sake of convenience, and the dimensional ratios of the respective components are different from actual ones. The materials, dimensions, and the like exemplified in the following description are merely examples, and the present invention is not limited thereto, and can be carried out by appropriately changing within a range that exerts the effects of the present invention. In the element of the present invention, other layers may be provided as long as the effect of the present invention is achieved.

Figure 1B:
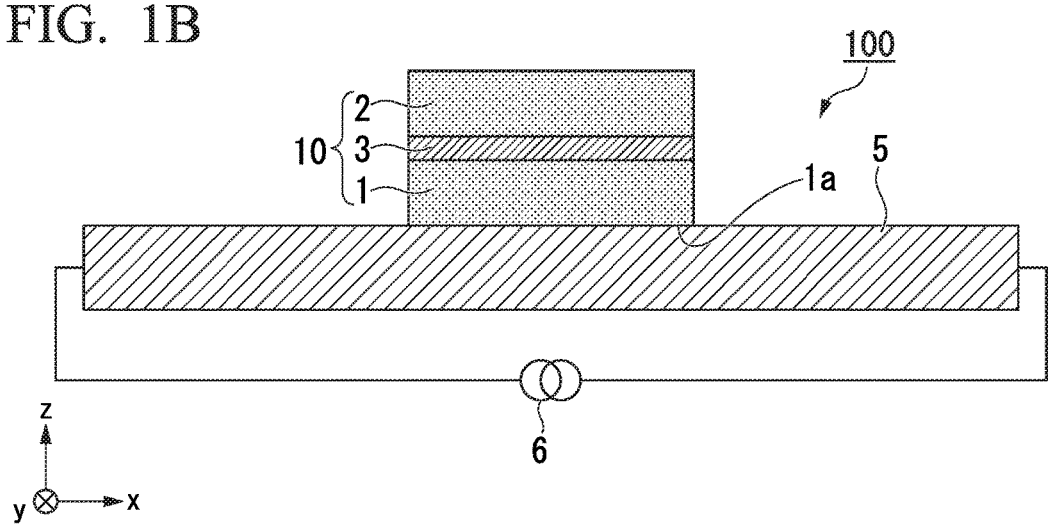
FIG. 1B is a schematic view for explaining a spin current magnetization rotational element according to an embodiment of the present invention and a cross-sectional view.

FIGS. 1A and 1B show schematic diagrams of an example of a spin current magnetization rotational element according to one embodiment of the present invention. FIG. 1A is a plan view and FIG. 1B is a cross-sectional view taken along line X-X, which is the center line in the width direction of the antiferromagnetic spin-orbit torque wiring 5 of FIG. 1A.

The spin current magnetization rotational element 100 shown in FIGS. 1A and 1B has the magnetization free layer 10 including a synthetic structure consisting of the first ferromagnetic metal layer 1, the second ferromagnetic metal layer 2 and the first non-magnetic layer 3 sandwiched by the first ferromagnetic metal layer 1 and the second ferromagnetic metal layer 2; and the antiferromagnetic spin-orbit torque wiring 5 that extends in the second direction (x direction) perpendicular to the first direction (z direction) corresponding to the lamination direction of the synthetic structure and is joined to the first surface 1a of the first ferromagnetic metal layer, wherein the spin current magnetization rotational element 100 is configured to change the magnetization direction of the magnetization free layer 10 by applying current to the antiferromagnetic spin-orbit torque wiring 5.

The "synthetic structure" in the present invention is composed of two ferromagnetic metal layers and a non-magnetic layer sandwiched between them (for example, a Ru layer or an Ir layer). In the synthetic structure, the two ferromagnetic metal layers are bonded by the antiferromagnetic coupling (RKKY coupling)) via the non-magnetic layer; and the magnetization directions of the two ferromagnetic metal layers are antiparallel each other.

In FIG. 1B, the current source 6 for applying current to (energizing) the antiferromagnetic spin-orbit torque wiring 5 in changing the magnetization direction of the magnetization free layer 10 is shown.

In the magnetization free layer 10, a strong antiferromagnetic coupling (RKKY coupling) is generated between the first ferromagnetic metal layer 1 and the second ferromagnetic metal layer 2 via the non-magnetic layer 3; and an effect equivalent to increasing volume of the second ferromagnetic metal layer 2 is obtained effectively. Accordingly, the thermal stability of the magnetization direction of the magnetization free layer 10 can be improved. As a result, the magnetization becomes resistant to the disturbance caused by the external magnetic field.

In the magnetization rotation, when the magnetization direction of the first ferromagnetic metal layer 1 is rotated by SOT from the antiferromagnetic spin orbital torque wiring, the magnetization direction of the second ferromagnetic metal layer 2 also rotates due to the antiferromagnetic coupling. Thus, the amount of the current is the same as one in the case where only the first ferromagnetic metal layer 1 is provided.

In addition, the antiferromagnetic spin-orbit torque wiring 5 is made of a material exhibiting antiferromagnetism.

In antiferromagnetic materials, spins playing an important role in magnetization in micro-level couple antiparallel; and the antiferromagnetic materials have no magnetism with zero spontaneous magnetism as a whole substance. However, the antiferromagnetic materials are known for showing a strong magnetic coupling (the pinning effect) on the bonded interface if it is bonded to a ferromagnetic material.

That is, as the interface spin of the antiferromagnetic material and the interface spin of the ferromagnetic metal layer are coupled by exchange coupling, the thermal stability is increased by the amount of the magnetic energy of the antiferromagnetic metal layer in addition to the magnetic energy of the ferromagnetic metal layer.

Therefore, the antiferromagnetic spin-orbit torque wiring 5 bonded to the first ferromagnetic metal layer 1 can improve the thermal stability of the magnetization direction of the magnetization free layer 10. As a result, the magnetization becomes resistant to the disturbance caused by the external magnetic field.

As described above, in the spin current magnetization rotational element of the present invention, the thermal stability is improved by the two kinds of couplings of: (1) the exchange coupling occurring at the interface between the antiferromagnetic layer and the first ferromagnetic metal layer; and (2) the antiferromagnetic coupling (RKKY coupling) by the synthetic structure of the first ferromagnetic metal layer and the second ferromagnetic metal layer. Accordingly, the spin current magnetization rotation element of the present invention has resistance to the disturbance by the external magnetic field.

<Antiferromagnetic Spin-Orbit Torque Wiring>

The antiferromagnetic spin-orbit torque wiring 5 is made of a material which produces a pure spin current by the spin Hall effect when a current flows and which exhibits antiferromagnetic properties. There are no particular restrictions on such a material as long as it is an antiferromagnetic material including a metal selected from the group consisting of Cr, Mn, Fe, Ni, Cu, As, Rh, Pd, Ir, Pt and Au. Alternatively, an antiferromagnetic material composed of an alloy containing the above-described metal can be used. Specific examples of the alloys include Cr, FeMn, NiMn, IrMn, PtMn, RhMn, PdPtMn, PtCrMn, CuMnAs, and $Mn_2Au$.

The antiferromagnetic spin-orbit torque wiring 5 can be made of IrMn. In this case, it can be configured in such a way that both of the magnetizations of the first ferromagnetic metal layer 1 and the second ferromagnetic metal layer 2 have orthogonal components, which are the lamination direction, and the orthogonal components of their magnetizations are antiparallel to each other. Since the orthogonal component can be induced in magnetization of the first ferromagnetic metal layer by using IrMn for the antiferromagnetic spin-orbit torque wiring 5, the magnetization direction can be fixed to the orthogonal direction. Accordingly, the degree of integration can be improved.

Here, the spin Hall effect is a phenomenon in which a pure spin current is induced in a direction orthogonal to the current direction based on the spin-orbit interaction when a current is passed through the material. Conventionally, a non-magnetic material having no magnetic property has been used as a supply source of the spin-orbit torque, but it became clear that an antiferromagnetic material can be used recently (see S. Fukami, C. Zhang, S. DuttaGupta, A. Kurenkov and H. Ohno, Nature materials (2016). DOI: 10.1038/NMAT 4566). That is, as a material capable of producing the spin Hall effect, an antiferromagnetic material is added in addition to the non-magnetic material.

The mechanism of the spin Hall effect in the antiferromagnetic material is not fully understood yet. It is not clear whether it is the same as the mechanism of the spin Hall effect in the conventional non-magnetic material or there is a different between them at this time. In any case, the generally understood mechanism of formation of the pure spin by the spin Hall effect is explained in reference to FIG. 2.

Figure 2:
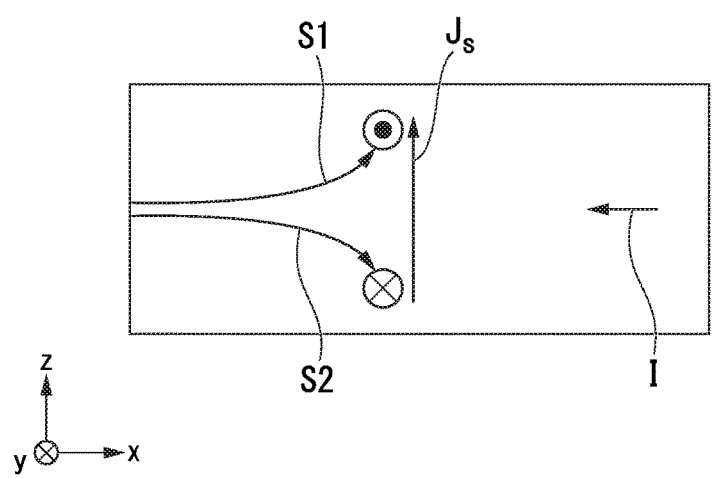
FIG. 2 is a schematic diagram for explaining the spin Hall effect.

As shown in FIG. 2, when the current I flows in the extending direction of the spin-orbit torque wiring, the first spin S1 oriented on the front side of the sheet surface and the second spin S2 oriented on the back side of the sheet surface are bent in the directions perpendicular to the current, respectively. The normal Hall effect and the spin Hall effect are common in that the movement (moving) electric charge (electron) is bent in the movement (moving) direction. On the other hand, in the normal Hall effect, charged particles moving in a magnetic field undergo Lorentz force to bend the direction of motion, whereas in the spin Hall effect the movement direction is bended by only electrons moving (only with current flow) without the presence of magnetic field, which is the major difference between them.

Since the number of electrons in the first spin S1 is equal to the number of electrons in the second spin S2 in the non-magnetic material (material which is not ferromagnetic material), the number of electrons in the first spin S1 going upward in the figure and the number of electrons in the second spin S2 going downward in the fire are the same. Therefore, the current as a net flow of charge is zero. This spin current unassociated with current is called the pure spin current specifically.

When electric current is passed through the ferromagnetic material, the point that the first spin S1 and the second spin S2 are bent in opposite directions is the same as in the case of the non-magnetic material. On the other hand, in the ferromagnetic material, either one of the first spin S1 or the second spin S2 is in a state of being in excess. As a result, a net flow of charges occurs (voltage is generated).

Here, the flow of the spin in the first spin S1 is defined as J↑, the flow of the spin in the second spin S2 as J↓, and the spin current as JS, it is defined by JS=J↑−J↓. IN FIG. 2, JS flows upward in the drawing as the pure spin current. Here, JS is a flow of spin with a polarizability of 100%.

In FIG. 1, when a ferromagnetic material is brought into contact with the upper surface of the antiferromagnetic spin-orbit torque wiring 5, the pure spin current diffuses and flood into the ferromagnetic material.

<Magnetization Free Layer>

The magnetization free layer 10 includes the synthetic structure consisting of the first ferromagnetic metal layer 1, the second ferromagnetic metal layer 2, and the first non-magnetic layer 3 sandwiched between the first ferromagnetic metal layer 1 and the second ferromagnetic metal layer 2. The magnetization free layer 10 is constituted from the first ferromagnetic metal layer 1, the second ferromagnetic metal layer 2, and the first non-magnetic layer 3 sandwiched between the first ferromagnetic metal layer 1 and the second ferromagnetic metal layer 2. The magnetization directions of the first ferromagnetic metal layer 1 and the second ferromagnetic metal layer 2 are made variable so as to be antiparallel to each other.

The first ferromagnetic metal layer 1 and the second ferromagnetic metal layer 2 can be either an in-face magnetization film whose magnetization direction is an in-face direction parallel to the layer or a perpendicular magnetization film whose magnetization direction is perpendicular to the layer.

As a material of the first ferromagnetic metal layer 1 and the second ferromagnetic metal layer 2, a ferromagnetic material, particularly a soft magnetic material can be applied. For example, metals selected from the group consisting of Cr, Mn, Co, Fe and Ni; alloys containing at least one of these metals; alloys containing these metals and at least one element of B, C, and N An alloy; or the like can be used. Specifically, Co—Fe, Co—Fe—B, Ni—Fe can be named. In addition, it is known that the antiferromagnetic coupling (RKKIY coupling) generated between two ferromagnetic metal layers through the non-magnetic layer functions as a spin orbital interaction of two ferromagnetic metal layers and a non-magnetic layer. In addition, it is known that the RKKY coupling is strengthened when it is in a Co/Ru/Co structure.

The materials of the first ferromagnetic metal layer 1 and the second ferromagnetic metal layer 2 may be the same or different.

It is preferable that the first ferromagnetic metal layer 1 and the second ferromagnetic metal layer 2 are configured so that the products of saturation magnetization and volume are equal between them.

In the spin current magnetization rotational element of the present embodiment, the RKKY coupling is strengthened by having the products of the saturation magnetization and the volume of the first ferromagnetic metal layer 1 and the second ferromagnetic metal layer 2 be equal to each other. Due to the strong RKKY coupling, the first ferromagnetic metal layer 1 is less susceptible to fluctuation with respect to the current magnetic field generated by the current flowing through the antiferromagnetic spin-orbit torque wiring at the time of reading.

The first non-magnetic layer 3 is not particularly limited as long as it is a non-magnetic metal material capable of interposing antiferromagnetic coupling (RKKY coupling) between the first ferromagnetic metal layer 1 and the second ferromagnetic metal layer 2. For example, one made of a non-magnetic metal selected from the group consisting of Cr, Cu, Mo, Ru, Rh, Re and Ir may be used.

Figure 3A:
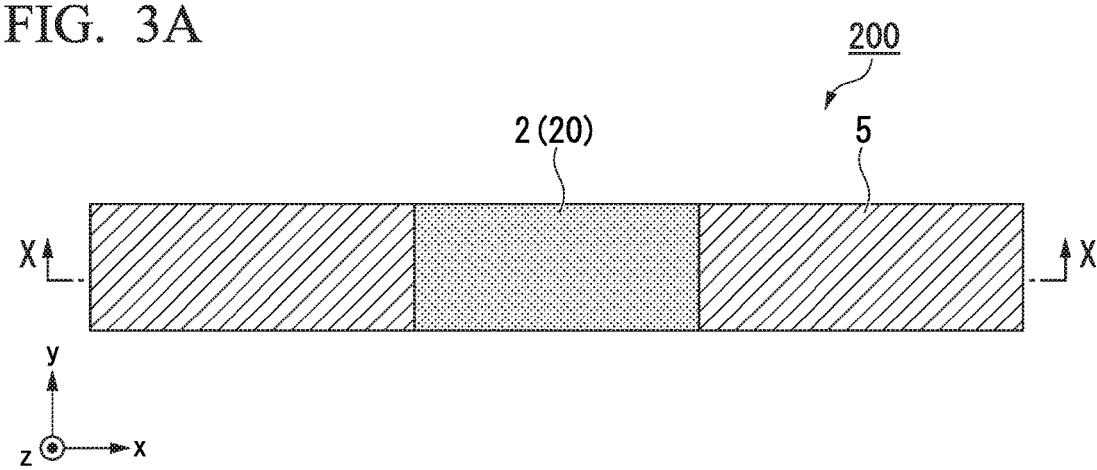
FIG. 3A is a schematic view for explaining a spin current magnetization rotational element according to another embodiment of the present invention, and a plan view.
Figure 3B:
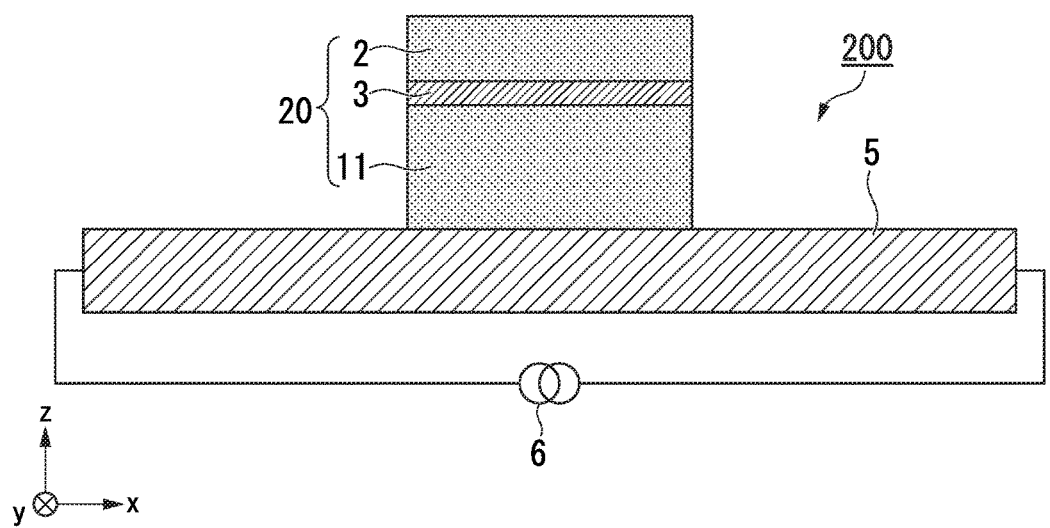
FIG. 3B is a schematic view for explaining a spin current magnetization rotational element according to another embodiment of the present invention, and a cross-sectional view.

FIGS. 3A and 3B show schematic diagrams of an example of a spin current magnetization rotational element according to another embodiment of the present invention. FIG. 3A is a plan view and FIG. 3B is a cross-sectional view taken along the line X-X, which is the center line in the width direction of the antiferromagnetic spin-orbit torque wiring 5 shown in FIG. 3A. The same reference numerals are used for the same configurations as those in FIGS. 1A and 1B, and a description thereof will be omitted.

The spin current magnetization rotational element 200 shown in FIGS. 3A and 3B differs from the spin current magnetization switching element 100 shown in FIGS. 1A and 1B in that the film thickness of the first ferromagnetic metal layer 11 is thicker than the film thickness of the second ferromagnetic metal layer 2 among the first ferromagnetic metal layer 11 and the second ferromagnetic metal layer 2 constituting the magnetization free layer 20.

In the spin current magnetization rotational element of this embodiment, by increasing the film thickness of the first ferromagnetic metal layer, it is possible to reduce diffusion of the pure spin to the second ferromagnetic metal layer. Moreover, by using the bulk scattering effect of the magnetic metal layer, the MR ratio can be improved.

Although not restricted, as an example of the film thickness for achieving the above-described effect of the present embodiment, the film thickness of the first ferromagnetic metal layer 11 is set to 1.0 nm to 10.0 nm, the thickness of the second ferromagnetic metal layer 2 is set to 0.5 nm to 5.0 nm, and the difference in film thickness can be, 0.5 nm to 9.5 nm, for example.

Figure 4A:
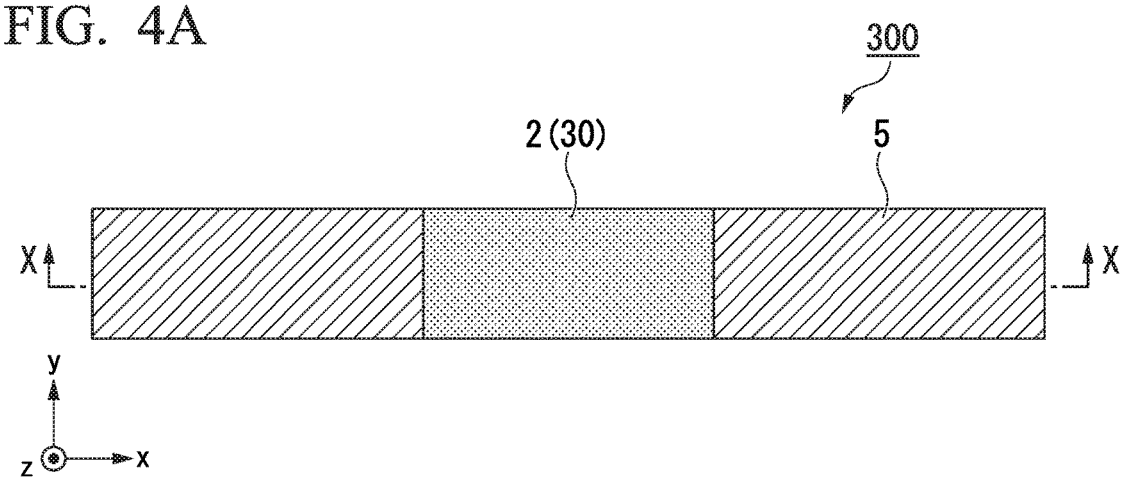
FIG. 4A is a schematic view for explaining a spin current magnetization rotational element according to another embodiment of the present invention, and a plan view.
Figure 4B:
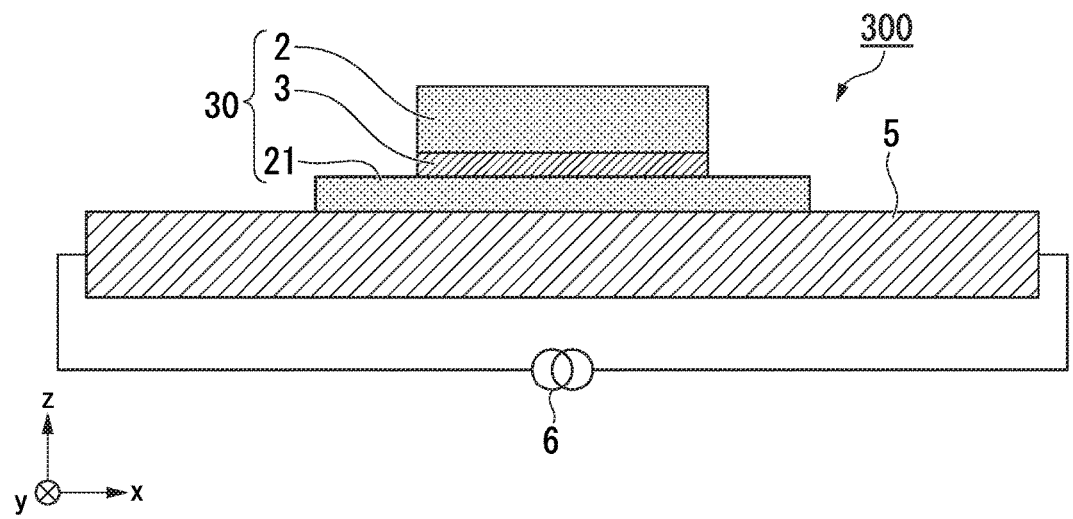
FIG. 4B is a schematic view for explaining a spin current magnetization rotational element according to another embodiment of the present invention, and a cross-sectional view.

FIGS. 4A and 4B show schematic diagrams of an example of a spin current magnetization rotational element according to another embodiment of the present invention. FIG. 4A is a plan view and FIG. 4B is a cross-sectional view taken along line X-X, which is the center line in the width direction of the antiferromagnetic spin-orbit torque wiring 5 shown in FIG. 4A. The same reference numerals are used for the same configurations as those in FIGS. 1A and 1B, and a description thereof will be omitted.

The spin current magnetization rotational element 300 shown in FIGS. 4A and 4B differs from the spin current magnetization switching element 100 shown in FIGS. 1A and 1B in that the film thickness of the first ferromagnetic metal layer 21 is thinner than the film thickness of the second ferromagnetic metal layer 2; and the area of the first ferromagnetic metal layer 21 as plan-viewed from the orthogonal direction is larger than the area of the second ferromagnetic metal layer 2 as plan-viewed from the orthogonal direction among the first ferromagnetic metal layer 21 and the second ferromagnetic metal layer 2 constituting the magnetization free layer 30.

In the spin current magnetization rotation element of this embodiment, by reducing the film thickness of the first ferromagnetic metal layer the reversal current can be decreased. Although the thermal stability is reduced by reducing the film thickness, the thermal stability can be secured by RKKY-coupling as described above.

In addition, in order to compensate the thin first ferromagnetic metal layer, by increasing the area, the volume reduction can be suppressed. Accordingly, reduction of the RKKY coupling can be suppressed.

Although not restricted, as an example of the film thickness for achieving the above-described effect of the present embodiment, the film thickness of the first ferromagnetic metal layer 21 is set to 0.5 nm to 5.0 nm, the thickness of the second ferromagnetic metal layer 2 is set to 1.0 nm to 10.0 nm, and the difference in film thickness can be, 0.5 nm to 9.5 nm, for example.

The spin current magnetization rotational element of the present invention can be applied to a magnetoresistance effect element as described later. The application is not limited to the magnetoresistance effect element, and can be applied to other uses. As another application, for example, it can also be used in a spatial light modulator in which the above-described spin current magnetization rotational element is disposed in each pixel and spatially modulates incident light by utilizing a magneto-optical effect. In addition, in the usage as a magnetic sensor, the magnetic field applied to the axis of easy magnetization of the magnet can be substituted by the antiferromagnetic spin-orbit torque wire (spin current magnetization rotational element) in order to avoid the hysteresis effect due to the coercive force of the magnet in the magnetic sensor.

(Magnetoresistance Effect Element)

A magnetoresistance effect element according to one embodiment of the present invention includes: the spin current magnetization rotational element of the present invention; a magnetization fixed layer in which the direction of magnetization is fixed, and a second non-magnetic layer sandwiched by the second ferromagnetic metal layer and the magnetization fixed layer.

Figure 5A:
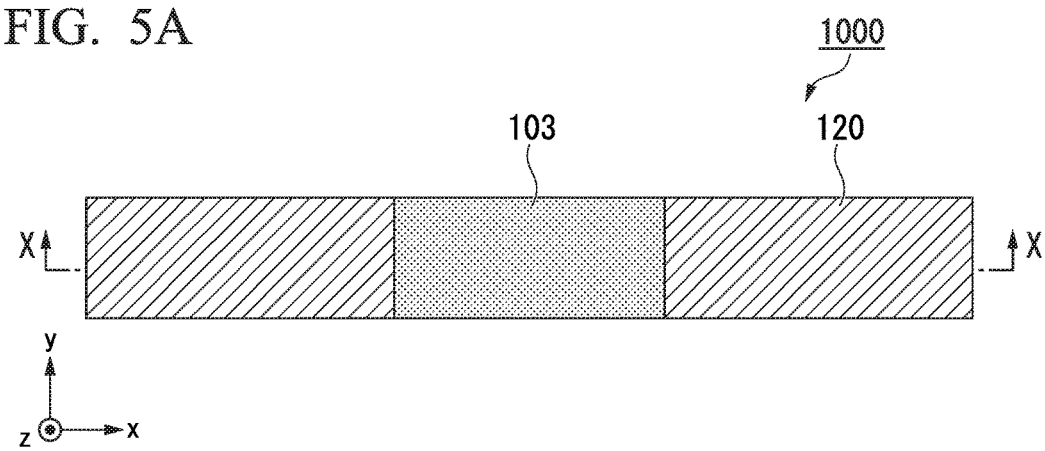
FIG. 5A is a schematic view for explaining a magnetoresistance effect element according to an embodiment of the present invention, and a plan view.
Figure 5B:
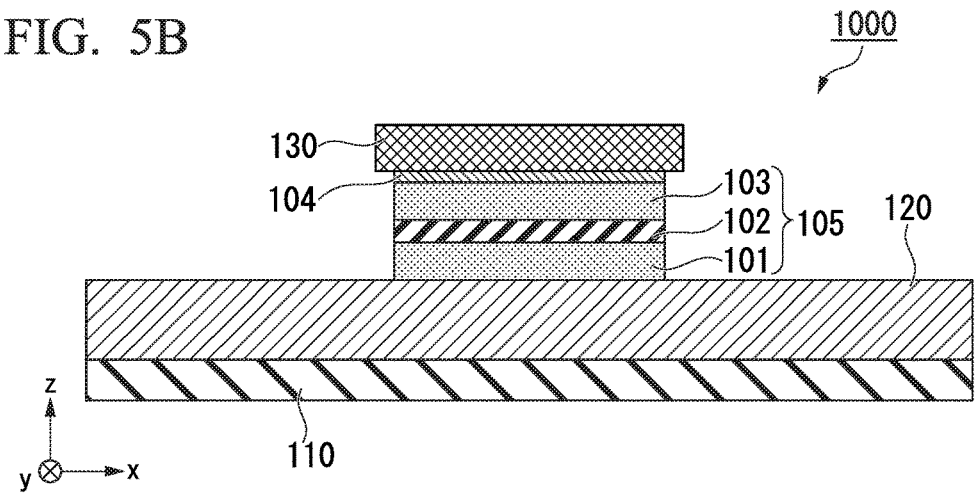
FIG. 5B is a schematic view for explaining a magnetoresistance effect element according to an embodiment of the present invention, and a cross-sectional view.

FIGS. 5A and 5B are schematic views of an example of a magnetoresistance effect element which is an application example of the spin current magnetization rotational element of the present invention and also is a magnetoresistance effect element according to an embodiment of the present invention. FIG. 5A is a plan view and FIG. 5 B is a cross-sectional view taken along the line X-X, which is the center line in the width direction of the antiferromagnetic spin-orbit torque wire 120 shown in FIG. 5A.

The magnetoresistance effect element 1000 shown in FIGS. 5A and 5B has the spin current magnetization rotational element (the magnetization free layer 101 and the antiferromagnetic spin-orbit torque line 120) of the present invention, the magnetization fixed layer 103 in which the magnetization direction is fixed, the second non-magnetic layer 102 sandwiched between the free layer 101 and the magnetization fixed layer 103. In addition, the magnetoresistance effect element 1000 shown in FIGS. 3A and 3B can also be said to have the magnetoresistance effect element portion 105 and the antiferromagnetic spin-orbit torque wire 120.

In FIGS. 5A and 5B, the substrate 110 on which magnetoresistance effect element 1000 is fabricated, the cap layer 104 and the wiring 130 are also shown.

The magnetoresistance effect element 1000 according to the embodiment of the present invention is provided with the antiferromagnetic spin orbital torque wiring 120 so that the magnetization rotation of the magnetoresistance effect element is performed only with SOT by the pure spin current (hereinafter, referred as "SOT-only" configuration). Alternatively, it can be configured in such a way that the SOT by the pure spin current is concurrently utilized in the conventional magnetoresistance effect element utilizing STT (hereinafter, referred as "STT and SOT combined" configuration). In the case of using the STT, a wiring 130 for flowing current in the lamination direction of the magnetoresistance effect element 1000 is necessary, and the wiring is formed on the magnetization fixed layer 103 directly or via another layer, for example, the cap layer 104, for example.

Hereinafter, as an example of a configuration in which the spin-orbit torque wiring extends in a direction intersecting the lamination direction of the magnetoresistance effect element portion, a case where the spin-orbit torque wiring extends in the orthogonal direction will be described.

<Magnetoresistance Effect Element Portion>

The magnetoresistance effect element portion 105 includes a magnetization fixed layer 103 in which the direction of magnetization is fixed, a magnetization free layer 101 in which the direction of magnetization is variable, a second non-magnetic layer 102 sandwiched between the magnetization fixed layer 103 and the magnetization free layer 101.

The magnetization of the magnetization fixed layer 103 is fixed in one direction and the magnetization direction of the magnetization free layer 101 is relatively changed, so that it functions as the magnetoresistance effect element portion 105. When applied to a coercive force difference type (pseudo spin valve type) MRAM, the coercive force of the second ferromagnetic metal layer is larger than the coercive force of the first ferromagnetic metal layer. In addition, when applied to an exchange bias type (spin valve type) MRAM, in the second ferromagnetic metal layer, the direction of magnetization is fixed by exchange coupling with the antiferromagnetic layer.

When the second non-magnetic layer 102 is made of an insulator, the magnetoresistance effect element portion 105 is a tunneling magnetoresistance (TMR) element, and when the second non-magnetic layer 102 is made of a metal, it is a giant magnetoresistance (GMR) element.

As the magnetoresistance effect element part of the present invention, a known magnetoresistance effect element part configuration can be used. For example, each layer may be composed of a plurality of layers or may be provided with another layer such as an antiferromagnetic layer for fixing the magnetization direction of the second ferromagnetic metal layer.

The magnetization fixed layer 103 is called a magnetization fixed layer, a reference layer, or the like; and the magnetization free layer 101 is called a magnetization free layer, a memory layer, or the like.

The magnetization fixed layer 103 may be either an in-face magnetization film whose magnetization direction is an in-face direction parallel to the layer or a perpendicular magnetization film whose magnetization direction is perpendicular to the layer.

As the material of the magnetization fixed layer 103 which is the third ferromagnetic metal layer, a known material can be used. For example, a metal selected from the group consisting of Cr, Mn, Co, Fe and Ni; and alloys exhibiting ferromagnetism containing at least one of these metals can be used. It is also possible to use an alloy containing these metals and at least one element of B, C, and N. Specifically, Co—Fe and Co—Fe—B can be named.

In order to obtain a higher output, it is preferable to use a Heusler alloy such as $Co_2FeSi$. The Heusler alloy contains an intermetallic compound having a chemical composition of $X_2YZ$, X is a transition metal element or a noble metal element of Co, Fe, Ni, or Cu group on the periodic table. Y is Mn, V, Cr, or a transition metal of the Ti group; or can take element species of X. Z is a typical element of group III to group V. For example, $Co_2FeSi$, $Co_2MnSi$, $Co_2Mn_{1-a}Fe_aAl_bSi_{1-b}$ and the like can be named.

In order to further increase the coercive force of the magnetization fixed layer 103 with respect to the magnetization free layer 101, an antiferromagnetic material such as IrMn or PtMn may be used as a material in contact with the magnetization fixed layer 103.

Furthermore, in order to prevent the leakage magnetic field of the magnetization fixed layer 103 from affecting the magnetization free layer 101, the magnetization fixed layer 103 may have a synthetic structure.

By having the magnetization fixed layer 103 with the synthetic structure, thermal stability can be further secured.

Furthermore, in the case where the magnetization direction of the magnetization fixed layer 103 is made perpendicular to the lamination plane, it is preferable to use a laminated film of Co and Pt. Specifically, the magnetization fixed layer 103 is made of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

For the second non-magnetic layer 102, a known material can be used. For example, when the second non-magnetic layer 102 is made of an insulator (in the case of a tunnel barrier layer), $Al_2O_3$, $SiO_2$, MgO, $MgAl_2O_4$, or the like can be used as a material thereof. In addition to these materials, a material in which a part of Al, Si, Mg is substituted with Zn, Be or the like can also be used. Among them, since MgO and $MgAl_2O_4$ are materials that can realize coherent tunneling, spin can be efficiently injected.

When the second non-magnetic layer 102 is made of a metal, Cu, Au, Ag, or the like can be used as a material thereof.

It is also preferable to provide a cap layer 104 on the surface of the magnetization fixed layer 103 opposite to the second non-magnetic layer 102. The cap layer 104 can suppress diffusion of elements from the magnetization fixed layer 103. The cap layer 104 also contributes to the crystal orientation of each layer of the magnetoresistance effect element portion 105. As a result, by providing the cap layer 104, it is possible to stabilize the magnetization of the magnetization fixed layer 103 and the magnetization free layer 101 of the magnetoresistance effect element portion 105 and to reduce the resistance of the magnetoresistance effect element portion 105.

For the cap layer 104, it is preferable to use a material with high conductivity. For example, Ru, Ta, Cu, Ag, Au, or the like can be used. The crystal structure of the cap layer 104 is preferably set appropriately from the fcc structure, the hcp structure and the bcc structure according to the crystal structure of the adjacent ferromagnetic metal layer.

Further, it is preferable to use any one selected from the group consisting of silver, copper, magnesium, and aluminum for the cap layer 104.

<Substrate>

Preferably, the substrate 110 has excellent flatness. In order to obtain a surface with excellent flatness, for example, Si, AlTiC or the like can be used.

An underlayer (not shown) may be formed on the surface of the substrate 110 on the side of the antiferromagnetic spin-orbit torque wiring 120. When the underlayer is provided, it is possible to control the crystal orientation of each layer including the antiferromagnetic spin orbital torque wiring 120 laminated on the substrate 110, and the crystallinity such as crystal grain size.

The underlayer preferably has insulating properties. This is to prevent the current flowing through the antiferromagnetic spin-orbit torque wire 120 and the like from dissipating. Various materials can be used for the underlayer.

For example, as one example, a layer of nitride containing at least one of element selected from the group of Ti, Zr, Nb, V, Hf, Ta, Mo, W, B, Al, and Ce with a (001)-oriented NaCl structure can be used as the underlayer.

As another example, a layer of a perovskite type conductive oxide represented by the composition formula $XYO_3$ with (002)-orientation can be used as the under layer. Here, the site X contains at least one element selected from the group of Sr, Ce, Dy, La, K, Ca, Na, Pb, and Ba; and the site Y contains at least one element selected from the group of Ti, V, Cr, Mn, Fe, Co, Ni, Ga, Nb, Mo, Ru, Ir, Ta, Ce, and Pb.

As another example, a layer of an oxide containing at least one element selected from the group of Mg, Al and Ce with a (001)-oriented NaCl structure can be used as the underlayer.

As another example, a layer containing at least one element selected from the group of Al, Cr, Fe, Co, Rh, Pd, Ag, Ir, Pt, Au, Mo, and W with a (001)-oriented tetragonal structure or cubic structure can be used as the under layer.

Further, the underlayer is not limited to a single layer, and a plurality of layers of the above example may be laminated. By devising the structure of the underlayer, the crystallinity of each layer of the magnetoresistance effect element portion 105 can be enhanced, and the magnetic characteristics can be improved.

<Wiring>

The wiring 130 is electrically connected to the magnetization fixed layer 103 of the magnetoresistance effect element portion 105. In FIGS. 5A and 5B, the wiring 130, the antiferromagnetic spin-orbit torque wiring 120, and the power supply (not shown) constitute a closed circuit; and current flows in the lamination direction of the magnetoresistance effect element portion 105.

The wiring 130 is not particularly limited as long as it has high conductivity. For example, aluminum, silver, copper, gold, or the like can be used.

In the magnetoresistance effect element 1000 shown in FIGS. 5A and 5B, an example of a so-called bottom pin structure in which the magnetization fixed layer (pinned layer) is arranged on the side far from the substrate 110 is shown. However, the structure of the magnetoresistance effect element 1000 is particularly limited by the configuration, and it may be in a so-called top pin structure.

(Magnetic Memory)

The magnetic memory (MRAM) of the present invention comprises a plurality of magnetoresistance effect elements of the present invention.

(Production Method)

The spin current magnetization rotational element of the present invention can be obtained by using a known film formation technique such as a sputtering method and a known shape processing technique such as photolithography and Ar ion milling. Hereinafter, a method of manufacturing a magnetoresistance effect element to which a spin current magnetization rotational element is applied will be described, thereby also explaining the manufacturing method of the spin current magnetization rotational element.

First, an antiferromagnetic spin-orbit torque wiring is fabricated on a substrate as a support. A layer of a metal constituting the antiferromagnetic spin-orbit torque wiring is formed by a sputtering method. If the material that constitutes the antiferromagnetic spin-orbit torque wiring is an alloy, the film is deposited by the binary simultaneous sputtering method. Various composition ratios can be obtained by adjusting the applied DC voltage and adjusting the sputtering rate of each composition ratio. Next, the antiferromagnetic spin-orbit torque wiring is processed into a predetermined shape by using a technique such as photolithography.

Then, portions other than the antiferromagnetic spin-orbit torque wiring are covered with an insulating film such as an oxide film. It is preferable to polish the antiferromagnetic spin-orbit torque wiring and the exposed surface of the insulating film by chemical mechanical polishing (CMP).

Next, a magnetoresistance effect element is fabricated. The magnetoresistance effect element can be manufactured by using known film deposition methods such as sputtering. In the case where the magnetoresistance effect element is a TMR element, for example, the tunnel barrier layer is formed by: first sputtering a thin film of metal to be divalent cations of magnesium, aluminum and multiple non-magnetic elements in a film thickness of about 0.4-2.0 nm. Then, natural oxidation is performed by plasma oxidation or oxygen introduction. After that, by performing a heat treatment, the thin metal film is formed. In addition to the sputtering method, a vapor deposition method, a laser ablation method, an MBE method, and the like can be named as the film deposition method.

It is preferable to perform annealing treatment on the obtained laminated film. The layer formed by reactive sputtering is amorphous and needs to be crystallized. For example, when Co—Fe—B is used as the ferromagnetic metal layer, a part of B is crystallized by being annealed.

The magnetoresistance effect element manufactured by annealing improves the MR ratio as compared with the magnetoresistance effect element manufactured without annealing treatment. It is considered that the uniformity and the orientation of the crystal size of the tunnel barrier layer of the non-magnetic layer 3 are improved by the annealing treatment.

As the annealing treatment, preferably, heating is performed in an inert atmosphere such as Ar at a temperature of 300° C. or more and 500° C. or less for 5 minutes or more and 100 minutes or less. Then, it is heated to 100° C. or more and 500° C. or less for 1 hour to 10 hours in a state where a magnetic field of 2 kOe or more and 10 kOe or less is applied.

Known processing methods such as photolithography or the like can be used as a method for making the magnetoresistance effect element into a predetermined shape. First, after laminating the magnetoresistance effect element, a resist is applied to the surface of the magnetoresistance effect element opposite to the antiferromagnetic spin-orbit torque wiring. Then, a predetermined portion of the resist is cured, and the unnecessary portion of the resist is removed. The portion where the resist is cured becomes the protective film of the magnetoresistance effect element. The portion where the resist is cured matches with the shape of the finally obtained magnetoresistance effect element.

Then, processing such as ion milling and reactive ion etching (RIE) is performed on the surface on which the protective film is formed. The portion where the protective film is not formed is removed, and a magnetoresistance effect element of a predetermined shape is obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: First ferromagnetic metal layer
2: Second ferromagnetic metal layer
3: First non-magnetic layer
5: Antiferromagnetic spin-orbit torque wiring
10: Magnetization free layer
100, 200, 300: Spin current magnetization rotational element
101: Magnetization free layer
102: Second non-magnetic layer
103: Magnetization fixed layer
105: Magnetoresistance effect element part
1000: Magnetoresistance effect element

What is claimed is:

1. A spin current magnetization rotational element comprising:
    a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and
    an antiferromagnetic spin-orbit torque wiring that extends in a second direction intersecting with a first direction that is a lamination direction of the synthetic structure and is joined to the first ferromagnetic metal layer, wherein
    the spin current magnetization rotational element is configured to change a magnetization direction of the magnetization free layer by applying current to the antiferromagnetic spin-orbit torque wiring,
wherein
    the antiferromagnetic spin-orbit torque wiring is made of IrMn,
    magnetization of the first and second ferromagnetic metal layers has an orthogonal component with respect to the first direction, and
    the orthogonal component of the first ferromagnetic metal layer and the orthogonal component of the second ferromagnetic metal layer are antiparallel each other.

2. The spin current magnetization rotational element according to claim 1, wherein
    the antiferromagnetic spin-orbit torque wiring is made of an antiferromagnetic material containing a metal selected from a group consisting of Cr, Mn, Fe, Ni, Cu, As, Rh, Pd, Ir, Pt and Au; or an antiferromagnetic material made of an alloy containing a metal selected from a group consisting of Cr, Mn, Fe, Ni, Cu, As, Rh, Pd, Ir, Pt and Au.

3. The spin current magnetization rotational element according to claim 1, wherein
    the first non-magnetic layer is made of a non-magnetic metal selected from a group consisting of Cr, Cu, Mo, Ru, Rh, Re and Ir.

4. The spin current magnetization rotational element according to claim 2, wherein
    the first non-magnetic layer is made of a non-magnetic metal selected from a group consisting of Cr, Cu, Mo, Ru, Rh, Re and Ir.

5. A spin current magnetization rotational element comprising:
    a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and an antiferromagnetic spin-orbit torque wiring that extends in a second direction intersecting with a first direction that is a lamination direction of the synthetic structure and is joined to the first ferromagnetic metal layer, wherein the spin current magnetization rotational element is configured to change a magnetization direction of the magnetization free layer by applying current to the antiferromagnetic spin-orbit torque wiring, wherein the spin current magnetization rotational element is configured in such a way that a product of saturation magnetization and a volume of the first ferromagnetic metal layer equals to or more than a product of saturation magnetization and a volume of the second ferromagnetic metal layer.

6. The spin current magnetization rotational element according to claim 5, wherein the antiferromagnetic spin-orbit torque wiring is made of an antiferromagnetic material containing a metal selected from a group consisting of Cr, Mn, Fe, Ni, Cu, As, Rh, Pd, Ir, Pt and Au; or an antiferromagnetic material made of an alloy containing a metal selected from a group consisting of Cr, Mn, Fe, Ni, Cu, As, Rh, Pd, Ir, Pt and Au.

7. The spin current magnetization rotational element according to claim 5, wherein the first non-magnetic layer is made of a non-magnetic metal selected from a group consisting of Cr, Cu, Mo, Ru, Rh, Re and Ir.

8. The spin current magnetization rotational element according to claim 6, wherein the first non-magnetic layer is made of a non-magnetic metal selected from a group consisting of Cr, Cu, Mo, Ru, Rh, Re and Ir.

9. The spin current magnetization rotational element according to claim 5, wherein the antiferromagnetic spin-orbit torque wiring is made of IrMn, magnetization of the first and second ferromagnetic metal layers has an orthogonal component with respect to the first direction, and the orthogonal component of the first ferromagnetic metal layer and the orthogonal component of the second ferromagnetic metal layer are antiparallel each other.

10. The spin current magnetization rotational element according to claim 6, wherein the antiferromagnetic spin-orbit torque wiring is made of IrMn, magnetization of the first and second ferromagnetic metal layers has an orthogonal component with respect to the first direction, and the orthogonal component of the first ferromagnetic metal layer and the orthogonal component of the second ferromagnetic metal layer are antiparallel each other.

11. The spin current magnetization rotational element according to claim 7, wherein the antiferromagnetic spin-orbit torque wiring is made of IrMn, magnetization of the first and second ferromagnetic metal layers has an orthogonal component with respect to the first direction, and the orthogonal component of the first ferromagnetic metal layer and the orthogonal component of the second ferromagnetic metal layer are antiparallel each other.

12. The spin current magnetization rotational element according to claim 8, wherein the antiferromagnetic spin-orbit torque wiring is made of IrMn, magnetization of the first and second ferromagnetic metal layers has an orthogonal component with respect to the first direction, and the orthogonal component of the first ferromagnetic metal layer and the orthogonal component of the second ferromagnetic metal layer are antiparallel each other.

13. A magnetoresistance effect element comprising:
the spin current magnetization rotational element according to claim 1;
a magnetization fixed layer in which a magnetization direction is fixed; and
a second non-magnetic layer sandwiched by the second ferromagnetic metal layer and the magnetization fixed layer.

14. The magnetoresistance effect element according to claim 13, wherein the magnetization fixed layer includes the synthetic structure.

15. A magnetic memory comprising a plurality of the magnetoresistance effect element according to claim 13.

16. A spin current magnetization rotational element comprising:

a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and an antiferromagnetic spin-orbit torque wiring that extends in a second direction intersecting with a first direction that is a lamination direction of the synthetic structure and is joined to the first ferromagnetic metal layer, wherein the spin current magnetization rotational element is configured to change a magnetization direction of the magnetization free layer by applying current to the antiferromagnetic spin-orbit torque wiring, wherein a film thickness of the first ferromagnetic metal layer is thinner than a film thickness of the second ferromagnetic metal layer, and an area of the first ferromagnetic metal layer as plan-viewed from an orthogonal direction is larger than an area of the second ferromagnetic metal layer as plan-viewed from an orthogonal direction.

17. A spin current magnetization rotational element comprising:

a magnetization free layer, which includes a first ferromagnetic metal layer, a second ferromagnetic metal layer and a first non-magnetic layer sandwiched by the first ferromagnetic metal layer and the second ferromagnetic metal layer, magnetization directions of the first and second ferromagnetic metal layers being configured to be variable in such a way that the magnetization directions become antiparallel each other; and an antiferromagnetic spin-orbit torque wiring that extends in a second direction intersecting with a first direction that is a lamination direction of the magnetization fee layer and is joined to the first ferromagnetic metal layer, wherein the spin current magnetization rotational element is configured to change a magnetization direction of the magnetization free layer by applying current to the antiferromagnetic spin-orbit torque wiring.

18. A magnetoresistance effect element comprising:
a spin current magnetization rotational element;
a magnetization fixed layer in which a magnetization direction is fixed; and
a second non-magnetic layer sandwiched by the second ferromagnetic metal layer and the magnetization fixed layer,
the spin current magnetization rotational element comprising:
a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and
an antiferromagnetic spin-orbit torque wiring that extends in a second direction intersecting with a first direction that is a lamination direction of the synthetic structure and is joined to the first ferromagnetic metal layer, wherein
the spin current magnetization rotational element is configured to change a magnetization direction of the magnetization free layer by applying current to the antiferromagnetic spin-orbit torque wiring,
wherein
the spin current magnetization rotational element is configured in such a way that a product of saturation magnetization and a volume of the first ferromagnetic metal layer equals to or more than a product of saturation magnetization and a volume of the second ferromagnetic metal layer.

19. The magnetoresistance effect element according to claim 18, wherein the magnetization fixed layer includes the synthetic structure.

20. A magnetoresistance effect element comprising:
a spin current magnetization rotational element;
a magnetization fixed layer in which a magnetization direction is fixed; and
a second non-magnetic layer sandwiched by the second ferromagnetic metal layer and the magnetization fixed layer,
the spin current magnetization rotational element comprising:
a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and
an antiferromagnetic spin-orbit torque wiring that extends in a second direction intersecting with a first direction that is a lamination direction of the synthetic structure and is joined to the first ferromagnetic metal layer, wherein
the spin current magnetization rotational element is configured to change a magnetization direction of the magnetization free layer by applying current to the antiferromagnetic spin-orbit torque wiring,
wherein
a film thickness of the first ferromagnetic metal layer is thinner than a film thickness of the second ferromagnetic metal layer, and
an area of the first ferromagnetic metal layer as plan-viewed from an orthogonal direction is larger than an area of the second ferromagnetic metal layer as plan-viewed from an orthogonal direction.

21. The magnetoresistance effect element according to claim 20, wherein the magnetization fixed layer includes the synthetic structure.

22. A magnetic memory comprising a plurality of magnetoresistance effect elements,
the magnetoresistance effect element comprising:
a spin current magnetization rotational element;
a magnetization fixed layer in which a magnetization direction is fixed; and
a second non-magnetic layer sandwiched by the second ferromagnetic metal layer and the magnetization fixed layer,
the spin current magnetization rotational element comprising:
a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and
an antiferromagnetic spin-orbit torque wiring that extends in a second direction intersecting with a first direction that is a lamination direction of the synthetic structure and is joined to the first ferromagnetic metal layer, wherein
the spin current magnetization rotational element is configured to change a magnetization direction of the magnetization free layer by applying current to the antiferromagnetic spin-orbit torque wiring,
wherein
the spin current magnetization rotational element is configured in such a way that a product of saturation magnetization and a volume of the first ferromagnetic metal layer equals to or more than a product of saturation magnetization and a volume of the second ferromagnetic metal layer.

23. A magnetic memory comprising a plurality of magnetoresistance effect elements,
the magnetoresistance effect element comprising:
a spin current magnetization rotational element;
a magnetization fixed layer in which a magnetization direction is fixed; and
a second non-magnetic layer sandwiched by the second ferromagnetic metal layer and the magnetization fixed layer,
the spin current magnetization rotational element comprising:
a magnetization free layer including a synthetic structure consisting of a first ferromagnetic metal layer, a second ferromagnetic metal layer and a first non-magnetic layer sandwiched by the first ferromagnetic metal layer and the second ferromagnetic metal layer; and
an antiferromagnetic spin-orbit torque wiring that extends in a second direction intersecting with a first direction that is a lamination direction of the synthetic structure and is joined to the first ferromagnetic metal layer, wherein
the spin current magnetization rotational element is configured to change a magnetization direction of the magnetization free layer by applying current to the antiferromagnetic spin-orbit torque wiring,
wherein
a film thickness of the first ferromagnetic metal layer is thinner than a film thickness of the second ferromagnetic metal layer, and an area of the first ferromagnetic metal layer as plan-viewed from an orthogonal direction is larger than an area of the second ferromagnetic metal layer as plan-viewed from an orthogonal direction.

* * * * *